(12) United States Patent
Lammers et al.

(10) Patent No.: US 6,594,191 B2
(45) Date of Patent: Jul. 15, 2003

(54) SEGMENTED WRITE LINE ARCHITECTURE

(75) Inventors: Stefan Lammers, South Burlington, VT (US); Christian Arndt, Shelburne, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/016,859

(22) Filed: Dec. 13, 2001

(65) Prior Publication Data

US 2003/0112654 A1 Jun. 19, 2003

(51) Int. Cl.[7] .............................. G11C 7/00; G11C 11/00; G11C 8/00
(52) U.S. Cl. ................ 365/225.5; 365/158; 365/230.06
(58) Field of Search .............................. 365/225.5, 158, 365/171, 173, 230.06

(56) References Cited

U.S. PATENT DOCUMENTS 6,335,890 B1 * 1/2002 Reohr et al. ............. 365/225.5

* cited by examiner

*Primary Examiner*—Michael S. Lebentritt
*Assistant Examiner*—Nam Nguyen
(74) *Attorney, Agent, or Firm*—Slater & Matsil, L.L.P.

(57) ABSTRACT

This invention presents a novel write line segmentation architecture for writing magnetoresitive random access memories (MRAM). Only the memory cells in a selected segment get a high hard axis field generated by a write line current. Memory cells of deselected segments do not receive this hard axis field. This prevents an undesired state change in particularly sensitive memory cells.

25 Claims, 7 Drawing Sheets

SEGMENTED WRITE LINE ARCHITECTURE

FIELD OF THE INVENTION

This invention relates generally to semiconductor memory devices, and particularly to write line architectures for magnetoresistive random access memory (MRAM) storage cells.

BACKGROUND OF THE INVENTION

Semiconductor devices are used for integrated circuits in a wide variety of electrical and electronic applications, such as computers, cellular telephones, radios, and televisions. One particular type semiconductor device is a semiconductor storage device, such as random access memory (RAM) and flash memory. These semiconductor storage devices use an electrical charge to store information.

A recent development in semiconductor memory devices involves spin electronics, which combines traditional semiconductor technology and magnetism. Rather than using an electrical charge to indicate the presence of a binary "1" or "0", the spin of an electron is used. An example of such a spin electronic device is a magnetoresistive random access memory (MRAM) storage device, which includes conductive lines positioned perpendicular to one another in different metal layers. The place where the conductive lines intersect is known as a cross-point. In between the perpendicular conductive lines is a magnetic stack. The magnetic stack is placed at the cross-point, sandwiched between the conductive lines.

An electrical current flowing through one of the conductive lines induces a magnetic field around the conductive line. The induced magnetic field can align (or orient) the alignment (or orientation) of magnetic dipoles in the magnetic stack. The right hand rule is a way to determine the direction of a magnetic field induced by a current flowing in a particular direction. The right hand rule is well understood by those of ordinary skill in the art of the present invention.

A different current flowing through the other conductive line induces another magnetic field and can realign the polarity of the magnetic field in the magnetic stack. Binary information, represented as a "0" or "1", is stored as different alignments of the magnetic dipoles in the magnetic stack. A current of sufficient strength flowing through one of the conductive lines is sufficient to destroy the contents of the magnetic stacks coupled to it. However, currents flowing through both conductive lines are required to selectively program a particular magnetic stack.

The alignment of the magnetic dipoles in the magnetic stack changes the electrical resistance of the magnetic stack. For example, if a binary "0" is stored in the magnetic stack, the resistance of the magnetic stack will be different from the resistance of the same magnetic stack if a binary "1" is stored in the magnetic stack. It is the resistance of the magnetic stack that is detected and determines the logical value stored therein.

However, due to manufacturing variations, different magnetic stacks require magnetic fields of differing strength to realign the magnetic dipoles. For example, one magnetic stack may require a stronger magnetic field to realign its magnetic dipoles than another magnetic stack. To ensure that any magnetic stack can be realigned, magnetic fields of sufficient strength much be used. However, if the magnetic fields are too great, then overly sensitive magnetic stacks may be unintentionally realigned, resulting in the unintended destruction of data.

Because MRAM devices operate differently than traditional semiconductor memory devices, they introduce design and manufacturing challenges. A need has therefore arisen for a write line architecture to minimize the probability of erroneously realigning the magnetic dipoles of unselected magnetic stacks.

SUMMARY OF THE INVENTION

In one aspect, the present invention provides a MRAM storage device featuring a segmented write line architecture comprising a plurality of MRAM memory cells arranged into segments, a first master wordline that is decodable using address bits to select a single local wordline, a second master wordline that is decodable using address bits to select the single local wordline, a return line coupled to the local wordline, wherein the local wordline is coupled to a segment of MRAM memory cells and the first and second master wordlines provide a current of desired magnitude to align the MRAM memory cells and the return line is used to sink the current used to align the MRAM memory cells.

The present invention provides a number of advantages. For example, use of a preferred embodiment of the present invention permits the realignment of a selected magnetic stack with educed probability of inadvertently realigning an unselected magnetic stack by eliminating any unselected magnetic stacks seeing (being exposed to) the hard axis field. Also, the present invention provides a nearly invariant write current along the write line due to a decrease in the amount of parasitic write current encountered by the write current. An invariant write current increases the certainty of the occurrence of a realignment operation. The invariant write current also permits a reduced write margin to help ensure that unselected cells are not unintentionally realigned.

Additionally, since the present invention eliminates any unselected magnetic stacks being exposed to the hard axis field, a higher hard axis field can be used to ensure the realignment of the magnetic stack with a lower soft axis field to further reduce the probability of realigning an unselected magnetic stack due to exposure to the soft axis field.

Also, the plurality of write current lines permits a reduction in the size of the current sources, making them easier to place in the layout of the MRAM memory array.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

Figure 1:
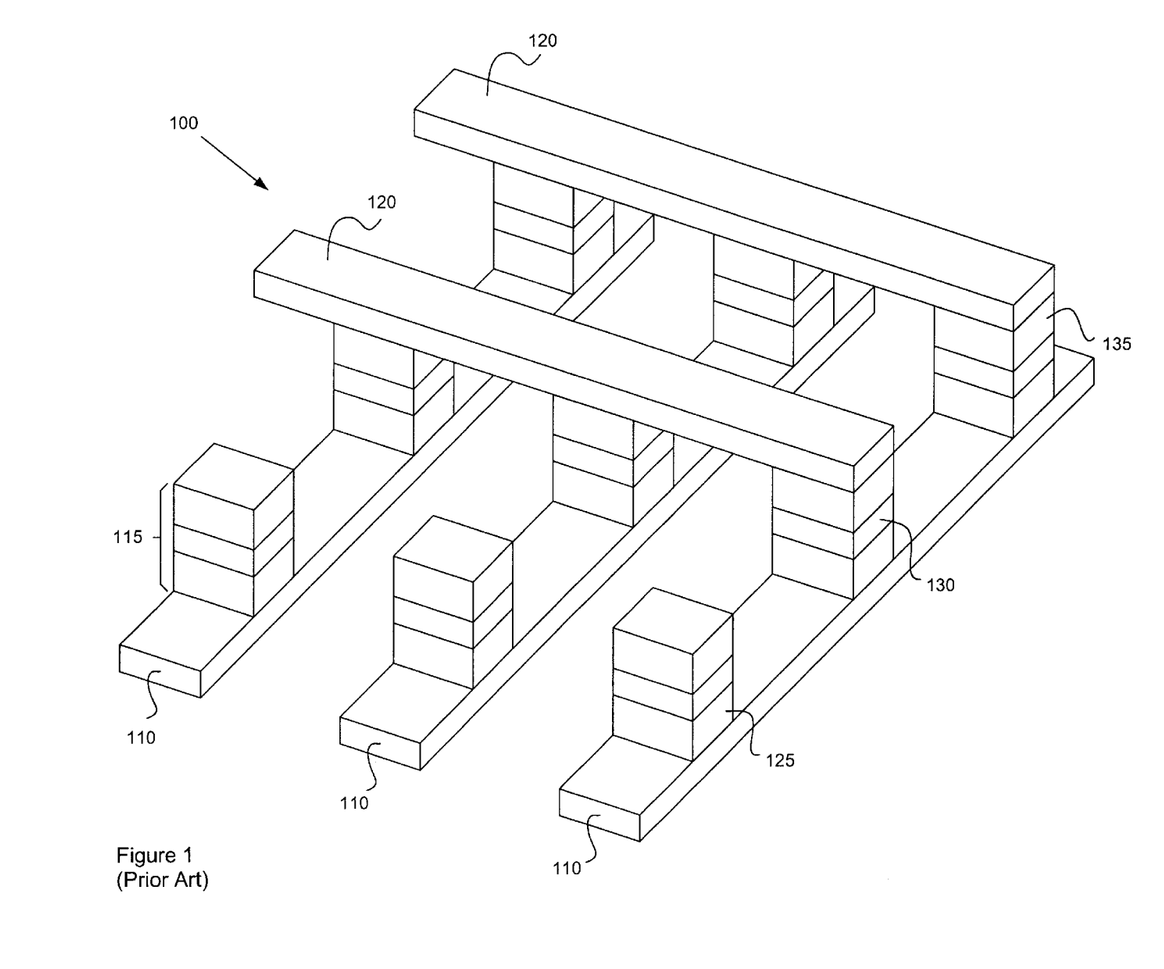
FIG. 1 illustrates a perspective view of a prior art MRAM storage device having magnetic stacks arranged in an array.

FIG. 1 illustrates a perspective view of a prior art MRAM storage device 100 having magnetic stacks arranged in an array. The device 100 has conductive lines 110 and 120 running in a first and second direction and comprised of a conductive material such as aluminum or copper. A magnetic stack 115 is formed over conductive line 110.

The magnetic stack 115 typically comprises a first magnetic layer 125, a dielectric layer 130, and a second magnetic layer 135. The magnetic layers 125 and 135 may be made of materials such as PtMn, CoFe, Ru, $Al_2$, $O_3$, and NiFe while the dielectric layer 130 may be made of $Al_2O_3$. The first magnetic layer 125 is often referred to as a hard magnetic layer (or hard layer) while the second magnetic layer 135 is often referred to as a soft magnetic layer (or soft layer). The soft magnetic layer is sometimes referred to as the easy magnetic layer.

Conductive lines 120, formed within a different metalization layer from the conductive lines 110, run in a different direction than (for example, perpendicular to) the conductive lines 110 are formed over the magnetic stacks 115. The conductive lines 110 and 120 function as the wordlines and bitlines of the storage device 100. The order of the magnetic stack 115 layers may be reversed, e.g., the hard layer 125 may be at the top while the soft layer 135 may be at the bottom of the magnetic stack 115. Similarly, the wordlines 110 and the bitlines 120 may be either above or below the magnetic stack 115.

Figure 2:
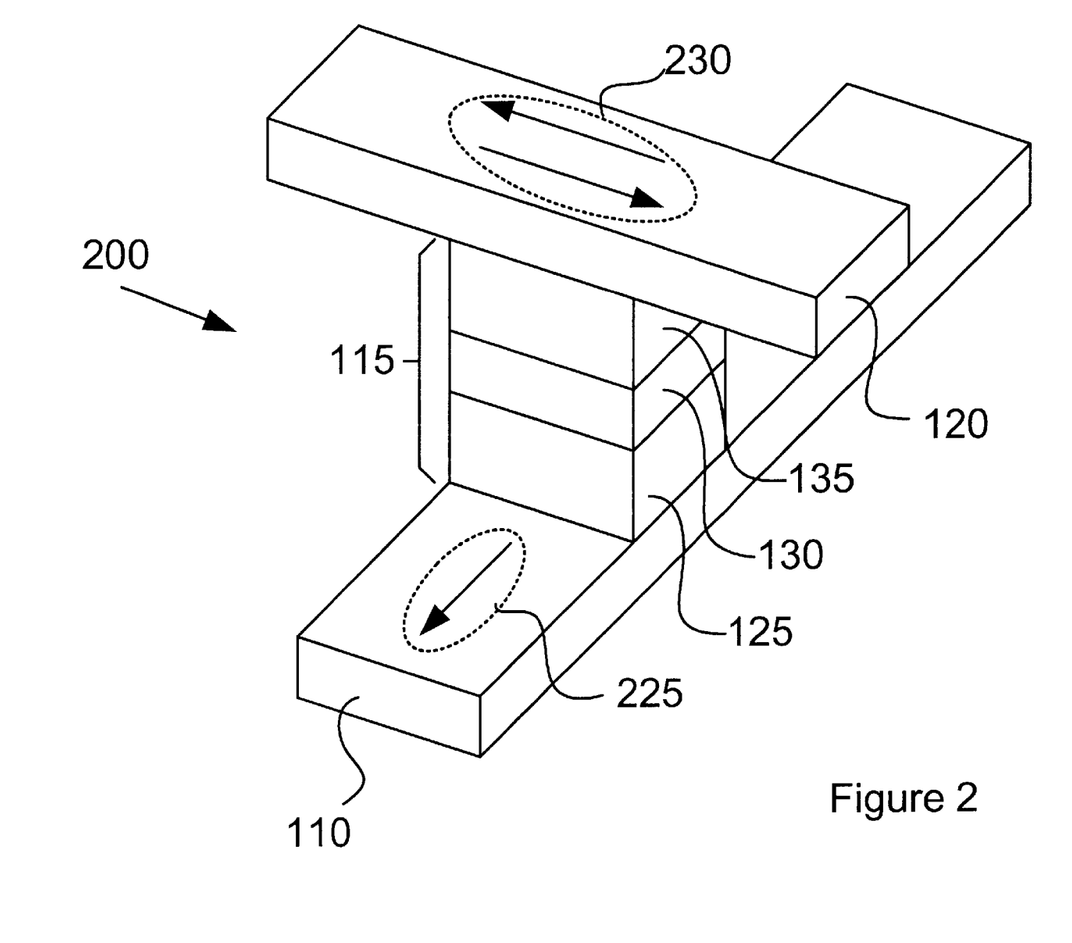
FIG. 2 illustrates electrical currents used for storing a value in a single magnetic stack of an MRAM storage device.

Referring to FIG. 2, a diagram illustrates electrical currents used for storing a value in a single magnetic stack 115 of an MRAM storage device 200. In the MRAM device 200, information is stored in the soft magnetic layer 135 of the magnetic stacks 115. To store information, a magnetic field is required. This magnetic field is provided by wordline and bitline currents, which are passed through conductive lines 110 and 120. The alignment of the magnetic dipoles of soft magnetic layer 135 is realigned by the magnetic fields induced by the electrical currents flowing through the conductive lines 110 and 120.

The alignment of the magnetic dipoles of the soft magnetic layer 135 in relation to the alignment of the magnetic dipoles of the hard magnetic layer 125 determines the electrical resistance of the magnetic stack 115, which is used to determine either a binary "0" or "1" logic state. When the magnetic dipoles of the two layers are aligned, the electrical resistance of the magnetic stack 115 is lower than when the magnetic dipoles are not aligned.

The alignment of the magnetic dipoles of the soft magnetic layer 135 can be realigned by magnetic fields induced by electrical currents in the wordline or the bitline or both. When the magnetic fields of the wordline, bitline, or a combination of the wordline and the bitline exceed a threshold, the magnetic dipoles of the soft magnetic layer 135 can be realigned. The particular alignment of the magnetic dipoles is determined by the polarity of the electrical current. Notice that the alignment of the magnetic dipoles of the hard magnetic layer 125 is set during fabrication and is not changed by the magnetic fields induced in the wordline or the bitline or both.

Figure 3:
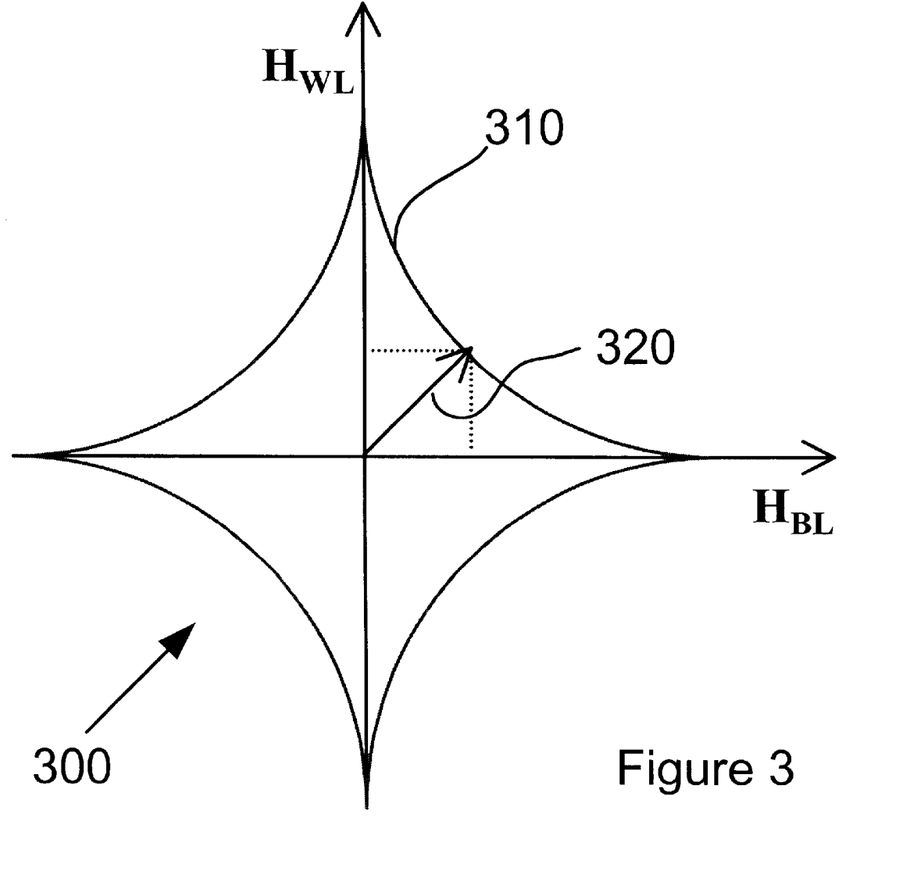
FIG. 3 illustrates an idealized asteroid displaying an idealized view of the switching characteristics of a single magnetic stack of an MRAM storage device.

Referring now to FIG. 3, an X-Y diagram illustrates an asteroid curve 300 displaying the idealized switching characteristics of a magnetic stack. The X-axis of the diagram displays the strength of the magnetic field on the bitline while the Y-axis displays the strength of the magnetic field on the wordline. The asteroid curve 300 itself, displays a level of magnetic field above which, the magnetic dipoles of the exemplary soft magnetic layer can be realigned. In other words, when either the magnetic field on the bitline or the wordline or both is greater in magnitude than the asteroid curve 300, the magnetic dipoles of the soft magnetic layer 135 can be aligned.

The asteroid curve 300 shows that an exceedingly large magnetic field on either the bitline or the wordline alone is sufficient to align the magnetic dipoles of the soft magnetic layer. Alternatively, a combination of smaller magnetic fields on both the bitline and the wordline can align the magnetic dipoles of the soft magnetic layer. The asteroid curve 300 can be expressed as a mathematical relationship: $H_{WL}^{2/3} + H_{BL}^{2/3} = H_K^{2/3}$, where $H_K$ is coercivity.

A vector 320 that is a combination of relatively small values of $H_{WL}$ and $H_{BL}$ is able to exceed the critical magnetic field strength displayed by the asteroid curve 300 and hence is able to align the magnetic dipoles of the soft magnetic layer.

Unfortunately, it is very unlikely that a realizable MRAM magnetic stack will exhibit the ideal behavior displayed in FIG. 3. Additionally, due to variations in the fabrication process, such as, differences in the shapes and sizes of the different cells, roughness of the different layers, electrical variations in the materials, etc., the behavior of different magnetic stacks within the same MRAM memory array or sub-array is likely to be quite different.

Figure 4:
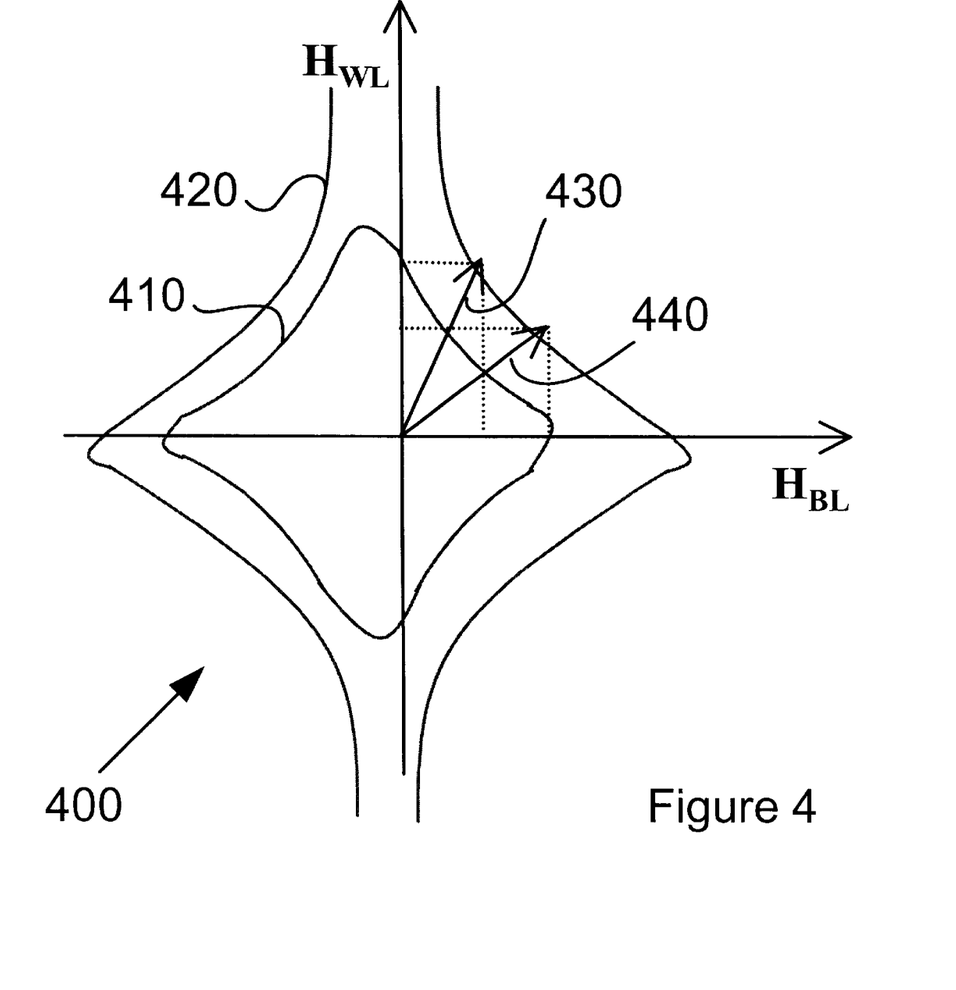
FIG. 4 illustrates a pair of realistic asteroid curves displaying the switching characteristics for a set of magnetic stacks of an MRAM memory array.

Referring now to FIG. 4, another X-Y diagram displays a pair of realistic asteroid curves 400 displaying an averaged switching characteristic for a group of magnetic stacks within a single memory array in a single MRAM memory array. The realistic asteroid curves 400 appear drastically different from the idealized asteroid curve displayed in FIG. 3. As discussed previously, the irregular shape of the asteroid curves are due to fabrication and materials variations, for example. The curves are actually the superposition of the switching characteristics of different magnetic stacks in a single memory array and not asteroid curves of two different cells.

A first asteroid curve 410 displays the magnetic field strength relationship between the two applied magnetic fields below which no magnetic dipole in any magnetic stack can be aligned. In other words, if the strength of the magnetic field due to the current from the bitline, wordline, or combination thereof lies within the first asteroid curve 410, then none of the magnetic stacks to which they are applied in the MRAM memory array can be aligned. A second asteroid curve 420 displays another magnetic field strength relationship between the two applied magnetic fields above which all magnetic dipoles in any magnetic stack can be aligned. In other words, if the strength of the magnetic field due to the current from the bitline, wordline, or combination thereof lies outside the second asteroid curve 420, then all of the magnetic stacks to which they are applied in the MRAM memory array can be aligned.

For magnetic fields with strengths lying in the region between the first asteroid curve 410 and the second asteroid curve 420, then the magnetic dipoles in some of the magnetic stacks to which they are applied can be aligned and some cannot. The magnetic stacks that may be aligned are more sensitive than the ones that cannot be aligned. Operating in the region between the two asteroid curves results in uncertainty and may result in certain magnetic stacks being inadvertently aligned while other magnetic stacks may not be aligned where alignment was expected.

A first vector 430 and a second vector 440 display exemplary valid combinations of relatively small magnetic fields on the bitline and the wordline that can be combined with the result of assured alignment of selected magnetic stacks. Note, for example, with vector 430, that a slight variation the magnetic field, the vector 430 may end up inside the region between the two asteroid curves and assured magnetic alignment is no longer possible.

Due to one standard array architecture of the MRAM storage device, known as a cross-point array architecture (shown in FIG. 1), all magnetic stacks sharing the same wordline (and bitline) as the selected magnetic stack will receive the same $H_{WL}$ (and $H_{BL}$) intended for the selected magnetic stack that a slight variation in the magnetic field could push the combined magnetic field outside of the first asteroid curve 410. If one or more of these magnetic stacks were particularly sensitive, the soft magnetic layer in the magnetic stacks may be unintentionally aligned.

Another standard array architecture of the MRAM storage device is the transistor array architecture (not shown), where each magnetic stack has an n-type transistor that is used to selectively isolate the read current of one magnetic stack from another. During a read operation, one read wordline is activate that in turn enables the n-type transistor of each memory cell along the wordline row. Therefore, only one memory cell along a bitline is activated at a given time. Transistor array architectures are fully compatible with the present invention. Transistor array architectures are well understood by those of ordinary skill in the art of the present invention.

One possible solution to the problem of unintentionally aligning sensitive magnetic stacks involves the segmentation of various write lines. Either the bitline or the wordline may be segmented, but more commonly the wordlines are segmented. Segmentation of the wordline involves partitioning a wordline into a plurality of local wordlines that are connected to a global wordline. The desired local wordline is then selected via a select line that enables a transistor that completes an electrical connection between the global wordline and the desired local wordline. The unselected local wordlines are electrically uncoupled from the global wordline by similar transistors.

Figure 5:
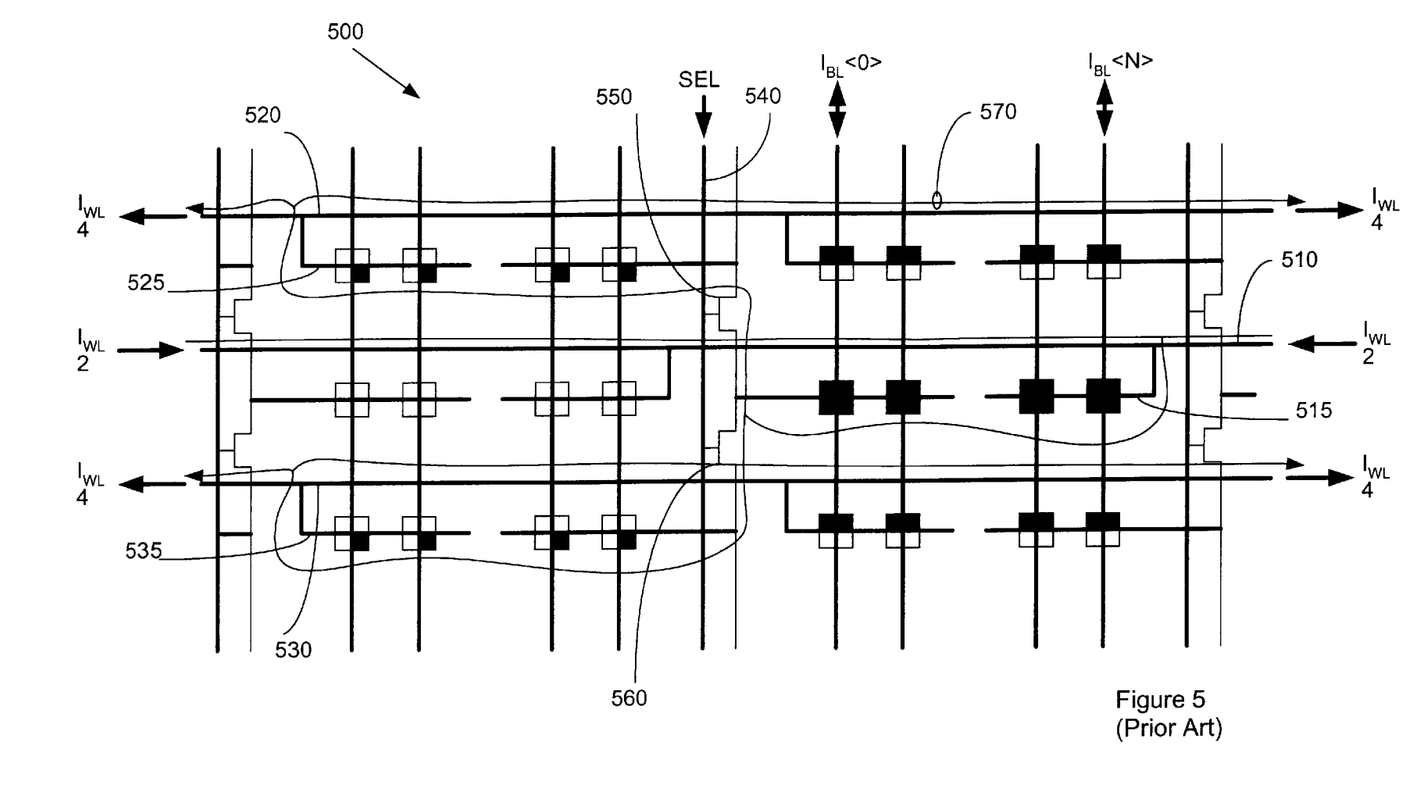
FIG. 5 illustrates a prior art write line segmentation architecture for realigning selected magnetic stacks of an MRAM memory array.

Referring now to FIG. 5, a schematic diagram 500 illustrates a portion of a prior art write line segmentation architecture used to reduce wordline current on unselected magnetic stacks. The schematic 500 displays a small portion of a MRAM memory array, where two columns display three rows of magnetic stacks each with additional rows of magnetic stacks not shown. Each of the two columns displayed represents a segment. A global wordline 510 traverses the entire width of the MRAM memory array. The schematic 500 displays two additional global wordlines 520 and 530.

Coupled to the global wordline 510 is a local wordline 515. The local wordline 515 is physically connected to the global wordline 510 at one end while at the other end it is coupled to other local wordlines 525 and 535 via transistors 550 and 560. The transistors 550 and 560 are turned on and off, electrically connecting and disconnecting the local wordline 515 to the other local wordlines 525 and 535, by a select line 540.

When there is desire to write to a particular segment, a wordline write current of appropriate value ($I_{WL}$) is placed on the global wordline 510. In one implementation, rather than sourcing the entire $I_{WL}$ at one end of the global wordline 510, half of the appropriate value ($I_{WL}/2$) is sourced at each end of the global wordline 510. A voltage is applied to the select line 540 to electrically connect the local wordline 515 to the other local wordlines 525 and 535. The electrical connection is then complete. Then, currents of appropriate value ($I_{BL}$) are applied to the bitlines.

The applied current flows through the global wordline 510 to the local wordline 515, inducing magnetic fields of the appropriate magnitude on the magnetic stacks. Along with the magnetic fields induced by the currents on the bitlines, the combined magnetic fields align the soft magnetic layers of the magnetic stacks in the selected local wordline. The wordline current continues through the transistors 550 and 560 and out the other local wordlines 525 and 535 and then out the other global wordlines 520 and 530 where they can be sinked. The complete current flow through the wordlines is displayed in FIG. 5 as a curved line 570 winding through the schematic 500.

The write line architecture displayed in FIG. 5 has a disadvantage in that there are other magnetic stacks that are coupled to the other global and local wordlines. The current flowing through these magnetic stacks will induce magnetic fields and if some of the magnetic stacks are particularly sensitive, the soft magnetic layer in the magnetic stacks-may be aligned by these magnetic fields. Additionally, the indirect path of the current through the MRAM memory array results in a significant amount of parasitic current that may lead to a widely variant current through the current path. The wide variance in the current can result in a sufficient variation in the magnetic field, resulting in uncertainty in the alignment operation.

Figure 6:
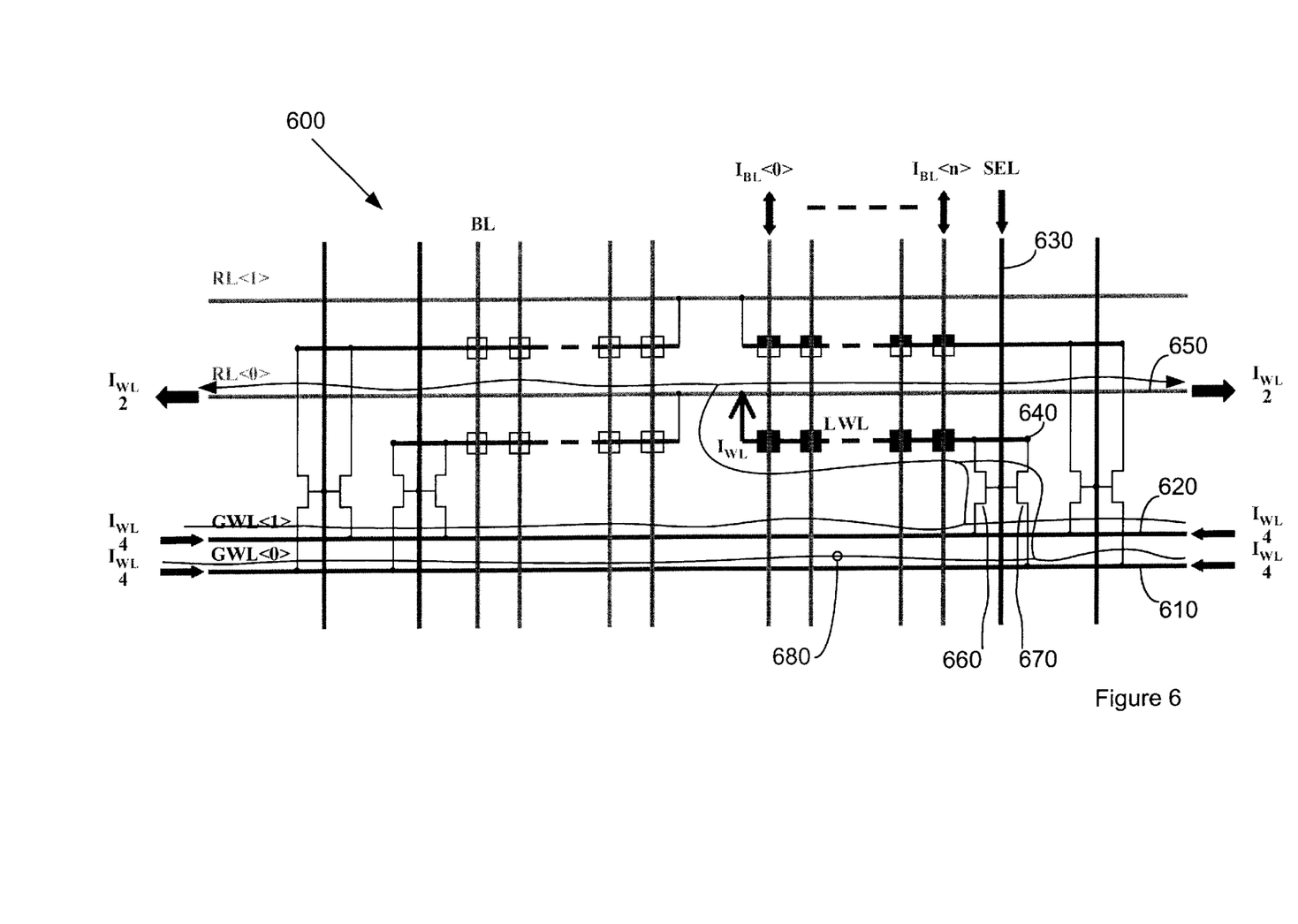
FIG. 6 illustrates a write line segmentation architecture for realigning selected magnetic stacks of an MRAM memory array according to a preferred embodiment of the present invention.

Referring now to FIG. 6, a schematic diagram 600 illustrates a portion of a write line segmentation architecture used to eliminate wordline current on unselected magnetic stacks according to a preferred embodiment of the present invention. The schematic 600 displays a small portion of a MRAM memory array, where two columns display two rows of magnetic stacks each with additional rows of magnetic stacks not shown. Each of the two columns displayed represents a segment. Two global wordlines 610 and 620 traverse the entire width of the MRAM memory array while a local wordline 640 traverses a single segment. The schematic 600 displays a global return line 650, which also traverses the width of the MRAM memory array.

The local wordline 640 is coupled to the two global wordlines 610 and 620 via a pair of transistors 660 and 670 which can be turned on and off by a select line 630. The local wordline 640 is also coupled to the global return line 650. The two global wordlines 610 and 620 are decoded from the address bits of the desired memory locations. Memory address bit decoding and selection are well understood by persons of ordinary skill in the art of the present invention.

When there is desire to write to a particular segment, current of appropriate value ($I_{WL}$) is sourced onto the two global wordlines 610 and 620. Because there are two global wordlines, each global wordline may carry half of the required current, or $I_{WL}/2$. A current source can be attached to each global wordline and provide the necessary current. Alternatively, each end of the two global wordlines maybe connected to current sources, therefore the individual current sources are required to only produce a fourth of the required current, $I_{WL}/4$. In this configuration, each global wordline has two current sources, one at each end, providing the necessary current. By reducing the amount of current produced by each current source, the overall size of each current source can be made smaller. Additionally, currents of the appropriate magnitude are applied to the bitlines.

An appropriate voltage is applied to the select line 630 to turn on the transistors 660 and 670. With the transistors turned on, the current can flow through the local wordline 640 and induce a magnetic field of the desired magnitude. Along with the magnetic fields induced by the currents on the bitlines, the combined magnetic fields align the soft magnetic layers of the magnetic stacks.

The current flowing through the local wordline 640 continues through to the global return line 650 where it can be sinked. According a preferred embodiment of the present invention, the global return lines are fabricated in a metal layer and are directly coupled to electrical ground. By being directly coupled to ground, the wordline current is given a direct path to ground and does not run through unselected segments. Alternatively, the global return line may be coupled to a variable voltage drop. The complete current flow through the wordlines and the return line is displayed in FIG. 6 as a curved line 680 winding through the schematic 600.

According to another preferred embodiment of the present invention, the wordline current flow may be reversed. Rather than having current sources connected to the global wordlines and a current sink connected to the global return lines, the current sources may be connected to the global return lines and the current sinks be connected to the global wordlines.

Referring back to FIG. 4, the vector 430 is a combination of magnetic fields induced by a high hard axis current and a low soft axis current. Since, the segmented write line architecture presented in FIG. 6 eliminates any exposure of unselected segments to the hard axis current, it is safe to raise the hard axis current to a maximum level that does not unintentionally realign any magnetic stacks and use a small soft axis current to align the magnetic stacks. The vector 440, on the other hand, is a combination of magnetic fields induced with a low hard axis current and a high soft axis current. Because segments other than the selected segment will be exposed to the soft axis current, it is not advisable to use a high soft axis current.

Figure 7:
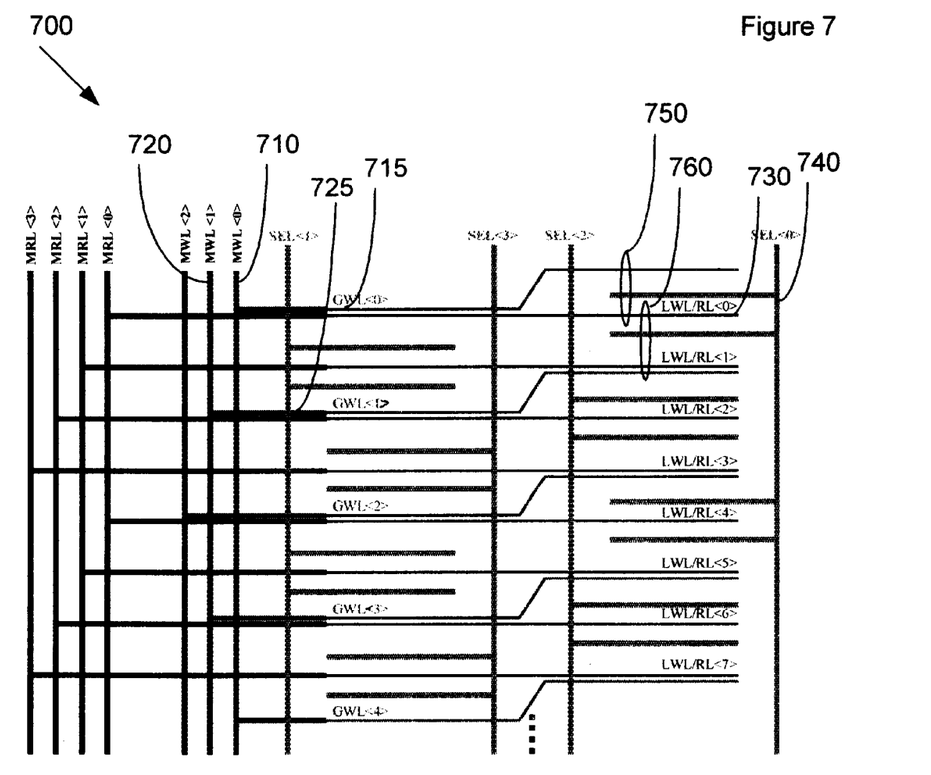
FIG. 7 illustrates a stick diagram of a layout for a segmented write line architecture for realigning selected magnetic stacks of an MRAM memory array according to a preferred embodiment of the present invention.

Referring now to FIG. 7, a schematic diagram 700 displays a stick diagram of a layout of a MRAM memory array with a segmented write line architecture according to a preferred embodiment of the present invention. The schematic 700 displays a possible implementation of the segmented write line architecture as displayed in FIG. 6. The schematic 700 does not display the physical geometries of an actual layout, but represents the different materials and layers needed to implement the segmented write line architecture. A person of ordinary skill in the art of the present invention will be able to generate an actual fabrication layout from the schematic 700. Note that the master word and the master return lines also appear on the right side of the array (not shown). This allows current to be applied and removed from both sides of the array.

The schematic 700 displays several rows of a single segment of the segmented write line architecture according to a preferred embodiment of the present invention. A set of lines, laid out in a metal layer, serves the master wordlines. FIG. 7 displays a set of three master wordlines, of which two are labeled "master wordline <0>" 710 and "master wordline <1>" 720. These master wordlines spawn the global wordlines, for example, "global wordlines <0>" 715 and "global wordline <1>" 725. Global wordlines <0> and <1> (715 and 725) correspond to global wordlines 610 and 620 from FIG. 6.

Referring back to FIG. 7, a local wordline 730 corresponding to local wordline 640 from FIG. 6 is also laid out in a metal layer, preferably in a different metal layer from the global wordlines, is also the return line 650 from FIG. 6. A set of magnetic stacks (not shown in FIG. 7) lays at the cross-points (not shown) of the local wordline 730 and a set of bitlines (also not shown in FIG. 7). The combination of local wordline 730, magnetic stacks, and bitlines form the storage structure of the MRAM memory array. The local wordline/return line 730 is coupled to a master return line. According to a preferred embodiment of the present invention, the return lines (both master and otherwise) are selectively coupled to electrical ground. Note that only the selected return lines are coupled to ground via a current sink. Note also that the return lines are laid out in a different metal layer and runs over the entire array.

A select line 740 functions as the select line 630 from FIG. 6 and a pair of transistors 750 and 760 (not directly displayed as transistors in FIG. 7) are controlled by a voltage level on the select line 740 to couple or un-couple the local wordline to the global wordline. An exemplary current flow through the array is as follows (initiating at master wordlines <0> 710 and <1> 720): current flows from the master wordlines through the global wordlines through a metal layer below the local wordlines to the right edge of the local wordline <0> 730 and through the local wordline <0> 730 (from right to left in FIG. 7). It then flows through return line <0> (from left to right in FIG. 7) via a contact connecting the local wordline and the return line. Finally, the current reaches the master return line where it is sinked to ground. The current flow discussed above is when the current flows through master wordlines <0> 710 and <1> 720 through to return line <0>. Different combinations of wordlines, segments, and return lines will result in the current flowing through different paths.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A magnetoresistive random access memory (MRAM) storage device with a segmented write line architecture, the MRAM storage device comprising:

a plurality of MRAM memory cells arranged into segments;

a first master wordline, which can be decoded out using address bits to select a single local wordline;

a second master wordline which can be decoded out using address bits to select the single local wordline;

a return line coupled to the single local wordline; and wherein:

the single local wordline is coupled to a segment of MRAM memory cells;

the first and second master wordlines are used to provide a hard axis current of desired magnitude for use in aligning the MRAM memory cells; and the return line used to sink the hard axis current used to align the magnetic dipole.

2. The MRAM storage device of claim 1, wherein the first and second master wordlines each carry a current equal to ½ times the hard axis current.

3. The MRAM storage device of claim 2, wherein the first and second master wordlines each possesses a first end and a second end, and wherein current is applied on each end of the first and second master wordlines and the current at each end of the first and second master wordlines is equal to ¼ times the, hard axis current.

4. The MRAM storage device of claim 3, wherein the superposition of the current applied on each end of each master wordline is equal to ½ times the hard axis current.

5. The MRAM storage device of claim 1, wherein the first and second master wordlines are selectively coupled to a plurality of local wordlines and a set of address bits are used to decode the selection of the single local wordline.

6. The MRAM storage device of claim 5, wherein the hard axis current is applied only to the single local wordline.

7. The MRAM storage device of claim 5, wherein each local wordline of the plurality of local wordlines is coupled to two master wordlines.

8. The MRAM storage device of claim 1, wherein the return line is coupled to electrical ground.

9. The MRAM storage device of claim 1, wherein the return line is coupled to a variable voltage drop.

10. The MRAM storage device of claim 1, wherein the return line is fabricated in a metal layer.

11. The MRAM storage device of claim 1, wherein the return line and the local wordlines are fabricated in different metal layers.

12. The MRAM storage device of claim 1, wherein the global wordlines and the return line are fabricated in different metal layers.

13. The MRAM storage device of claim 1, wherein the global wordlines and the local wordlines are fabricated in different metal layers.

14. The MRAM storage device of claim 1, wherein each MRAM memory cell is coupled to a bitline and the bitline carries a soft axis current, and wherein the superposition of the soft axis current and the hard axis current is at least equal to a current required to align the magnetic dipole of the MRAM memory cell.

15. The MRAM storage device of claim 14, wherein the soft axis current is small compared to the hard axis current to reduce the probability of unintentionally realigning unselected magnetic stacks.

16. The MRAM storage device of claim 1, wherein the hard axis current is a highest current that does not unintentionally change the alignment of a MRAM memory cell.

17. The MRAM storage device of claim 14, wherein the soft axis current in and of itself is insufficient to align the magnetic dipole of the MRAM memory cells.

18. The MRAM storage device of claim 14, wherein the hard axis current in and of itself is insufficient to align the magnetic dipole of the MRAM memory cells.

19. The MRAM storage device of claim 14, wherein the hard axis current does not flow through any unselected MRAM memory cells.

20. The MRAM storage device of claim 1, wherein the MRAM storage device comprises:

a first magnetic layer;

a second magnetic layer; and a dielectric layer horizontally disposed between the first and second magnetic layers.

21. The MRAM storage device of claim 20, wherein the MRAM storage device further comprising:

a local wordline coupled to one magnetic layer;

a bitline coupled to the other magnetic layer; and wherein the local wordline and the bitline are perpendicularly oriented.

22. The MRAM storage device of claim 1, wherein the MRAM storage device is laid out using a cross point architecture.

23. The MRAM storage device of claim 1, wherein the MRAM storage device is laid out using a transistor array architecture.

24. A circuit comprising a MRAM storage device as specified in claim 1.

25. An electronic device comprising a MRAM storage device as specified in claim 1.

* * * * *